United States Patent [19]
Roth et al.

[11] Patent Number: 5,903,152
[45] Date of Patent: May 11, 1999

[54] MAGNET SYSTEM

[75] Inventors: Gerhard Roth; Klaus Goebel, both of Rheinstetten, Germany; René Jeker, Hombrechtikon; Markus Jakob, Uster, both of Switzerland

[73] Assignee: Bruker Analytik GmbH, Rheinstetten, Germany

[21] Appl. No.: 08/761,460

[22] Filed: Dec. 4, 1996

[30] Foreign Application Priority Data

Dec. 30, 1995 [DE] Germany .................. 195 49 211

[51] Int. Cl.$^6$ ............................................ G01V 3/00
[52] U.S. Cl. ................................. 324/319; 324/322
[58] Field of Search ............................ 324/319, 320, 324/322, 318, 300; 505/856, 869; 335/296

[56] References Cited

U.S. PATENT DOCUMENTS

| | | | |
|---|---|---|---|
| 3,521,207 | 7/1970 | Britton et al. | 505/869 |
| 5,565,763 | 10/1996 | Arrendale et al. | 505/869 |
| 5,644,233 | 7/1997 | Bird et al. | 324/319 |
| 5,721,490 | 2/1998 | Takano et al. | 324/322 |

FOREIGN PATENT DOCUMENTS 0181575  5/1986  European Pat. Off. .

OTHER PUBLICATIONS

Murakami Y et al: "Identification of control system of superconducting magent" Applied Superconductivity Conference 1980, Santa Fe, NM; USA Sep. 29–Oct. 2 1980, vol. MAG–17, No. 1, IEEE, pp. 525–528.

M.H. Wilson, Superconducting Magnets, Oxford, 1983, pp. 272–274.

*Primary Examiner*—Louis M. Arana
*Attorney, Agent, or Firm*—Paul Vincent

[57] ABSTRACT

The invention concerns a magnet system (1) for charging of a superconducting magnet coil (3). The magnet system (1) is characterized by control means (4) for reading-in and controlling which read-in data of a storage medium (7) associated with the superconducting magnet (3) into a power supply (2) and which control the charging of the superconducting magnet coil (3) by the power supply (2) using the read-in data. The magnet system (1) facilitates a fully automatic, safe and rapid charging of a superconducting magnet coil (3) and guarantees better reproduceability and an optimal charging process.

18 Claims, 1 Drawing Sheet

MAGNET SYSTEM

BACKGROUND OF THE INVENTION

The invention concerns a magnet system having a power supply for charging a superconducting magnet coil.

Superconducting magnet coils, in particular for nuclear magnetic resonance experiments, are usually operated in persistent current mode. A power supply is connected to the magnet coil in preparation for operation of such a magnet system in order to charge the magnet coil with current. Subsequent thereto the power supply is separated and removed (see e.g. M. H. Wilson, Superconducting Magnets, Oxford, 1983, pages 272–274). The charging process of a superconducting magnet coil requires experience and technical skill. In particular, it is important to charge carefully in order to prevent a quench, i.e. a break-down of the superconducting state into the normally conducting state. Such a quench can lead to substantial coolant losses and costs time since the coolant must be refilled prior to newly charging.

In order to prevent a quench it is important to follow a particular charging program in order to charge the coil in a reliable but nevertheless rapid fashion. In addition the properties of a particular coil, in particular its field homogeneity and field stability, can be influenced by the charging procedure. In order to obtain as homogeneous a field for a particular coil as possible, the charging is to be carried out in accordance with a procedure individually tailored to this coil. This is usually done with the assistance of charging instructions. The individualized charging process is carried out by hand by, for example, a technician. Depending on the experience and reliability of the technician it is possible for the power supply to be operated in such a fashion that the magnet is not optimally charged or such that the charging process requires a significantly longer amount of time. In addition the reproduceability of the charging is not guaranteed completely and quenching of the magnet system is possible through improper charging of the coil.

It is consequently the purpose of the present invention to further improve a power supply of the above mentioned kind in such a fashion that the safety, quality, and speed of charging of the magnet coil is improved.

SUMMARY OF THE INVENTION

This purpose is achieved in that control means are provided for reading-in and for controlling, which read storage medium data associated with the superconducting magnet into the power supply and which control the charging of the superconducting magnet coil by the power supply using the read-in data.

In this manner the purpose of the invention is completely achieved. The storage medium which is, in each case, associated with a particular magnet coil contains important data or control parameters which are suitable for this coil. Communication between this storage medium and the control means installed in the power supply allows for the charging to be carried out by the control means in such a fashion that each coil is charged with a charging procedure which is optimally suited therefor. In this manner improper charging of the coil is not possible and an optimized charging can be carried out in a fully automatic fashion. The responsible technician is free to carry out other tasks during the charging process and a safe and reproduceable charging is nevertheless guaranteed.

The superconducting magnet coil is arranged in a cryostat and it is advantageous when the storage medium has at least one terminal which is accessible from outside the cryostat and which can be connected to the power supply e.g. via a cable. This measure has the advantage that the storage medium can also be permanently disposed outside the cryostat, wherein the storage medium and the associated magnet always remain connected to each other. The storage medium terminals accessible from outside the cryostat guarantees a simple connection between the power supply and the magnet system via e.g. a cable, wherein the charging data of the superconducting magnet coil stored in the storage medium can be transferred to the power supply.

It is advantageous when the storage medium comprises an EPROM. This has the advantage of a conventional and commercially available storage element.

Embodiments are also possible with which the storage medium has a bar code. This has the advantage that an optical read-out of the information stored in the storage medium can be carried out using conventional technology. A sticker having a bar code can be easily placed on the cryostat. It is non-magnetic and can be read-out using a light pen. Some spectrometers already have bar code devices.

It is advantageous when the storage medium contains a control program for controlled charging of the magnet coil. This has the advantage that each magnet coil, in a certain sense, physically carries its own individual optimized charging procedure, wherein only minimal information must be stored in the power supply and the instructions necessary for the charging of a particular magnet coil are stored on the storage medium associated with that magnet coil and are, for example, mechanically connected to the coil cryostat.

It is advantageous when the control means are configured in such a fashion that charging can only take place after an electrical connection is established between the control means and the storage means This has the advantage that unauthorized or incorrect charging of the magnet is impossible. In this fashion the power supply can only be driven after particular information, commands, or limiting values stored on the storage medium have been read by the control means.

It is particularly advantageous when the charging takes place fully automatically. This has the advantage that a technician cannot disadvantageously influence the charging process. This also has the advantage that improper charging of the coil due to human error is not possible.

It is advantageous to provide for an electronic locking to prevent charging. This has the advantage that only charging controlled by the storage medium or the control medium is possible, wherein an unintentionally false charging of the coil can be safely prevented.

In an embodiment of the power supply in accordance with the invention, a locking means is provided to prevent improper charging steps which might lead to an incorrect or damaging charging of the magnet.

In an improvement of this embodiment limiting values are provided e.g. for the voltage and/or current. This has the advantage that the user is given a certain degree of freedom to intervene in the charging process. Only in certain cases where particular limiting values are exceeded to possibly endanger or negatively influence the charging process, is the charging program activated to prevent same.

It is possible for the control means to preferentially have at least a series of differing stored charging programs which are each associated with one or with a plurality of particular coils. In this manner it is possible to utilize a storage medium for each coil which only has a very limited storage capacity. The required storage capacity of the storage medium is thereby small and it is simple to permanently associate the corresponding storage medium with the superconducting magnet, for example, by disposing it on the cryostat.

It is advantageous when the storage medium is permanently attached to a cryostat containing the superconducting magnet. This has the advantage that the storage medium is permanently associated with the magnet coil using a fixed mechanical connection.

It is advantageous when the charging program is stored in a changeable fashion. This has the advantage that changing characteristics of the superconducting magnet can be taken into consideration.

It is advantageous when the charging program is defined by charging parameters stored on the storage medium. This has the advantage that the parameters which define particular instructions only require limited storage capacity on the storage medium.

In an embodiment, a charging program is provided for which facilitates a charging with continuously and generally smoothly changing parameters. This has the advantage that a gradual careful charging of the magnet can take place without having a technician constantly adjusting the voltage or current flow of the power supply in a step by step fashion.

It is advantageous when the magnet charging system in accordance with the invention is utilized to charge the magnet of a nuclear magnetic resonance spectrometer. Nuclear magnetic resonance spectrometers, in particular for high field and high resolution applications, require optimal homogeneity, wherein it is important for the charging process to be carried out particularly carefully.

A method for charging the superconducting magnet coil of the magnet system in accordance with the invention is characterized by the following steps:

a) the power supply is connected to the superconducting magnet coil via a current lead;

b) data from the storage medium are read into the control means in the power supply;

c) the superconducting switch is opened;

d) the superconducting magnet coil is automatically charged by the power supply in correspondence with the data read into the control means;

e) the superconducting switch is closed and the charging current is reduced by the power supply to zero;

f) the current leads are removed from the superconducting magnet coil.

The method has the advantage that the properties of the magnet system in accordance with the invention are taken into consideration in an optimal fashion in order to guarantee a safe and reproduceable charging of the magnet coil.

Further advantages of the invention can be derived from the description and the drawing. The above mentioned features and those to be further explained below can be utilized in accordance with the invention individually or collectively in arbitrary combination. The embodiments shown and described are not to be considered as exhaustive enumeration, rather have exemplary character only for illustration of the invention.

BRIEF DESCRIPTION OF THE DRAWING

FIG. 2b shows a corresponding magnetic field strength versus charging time curve according to FIG. 2a.

DESCRIPTION OF THE PREFERRED EMBODIMENT

Figure 1:
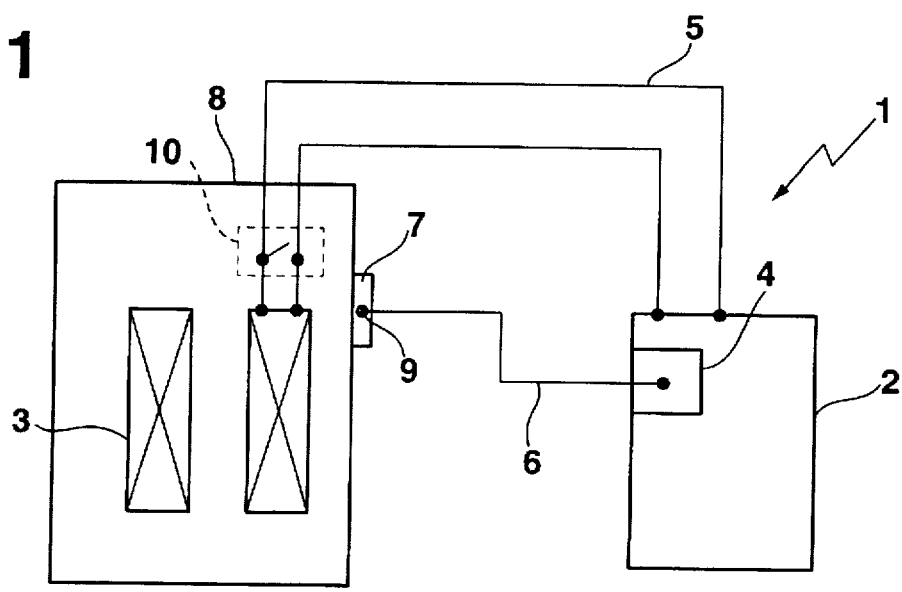
FIG. 1 shows a schematic representation of the magnet system in accordance with the invention.

FIG. 1 shows a magnet system 1 in accordance with the invention. The magnet system 1 has a power supply 2 as well as a superconducting magnet coil 3. The superconducting magnet coil 3 is disposed in a cryostat 8 and is connected to the power supply 2 during the charging procedure in a conducting fashion via a current cable 5. The system 1 comprises a storage medium 7 securely attached to the outside of the cryostat 8 as well as control means 4 integrated into the power supply 2. The control means 4 and the storage medium 7 are electrically connected to each other via control cable 6.

In order to charge the magnet coil 3 same is connected to the power supply 2 via the current cable 5 and the storage medium 7 is connected to the control means 4 via the control cable 6. The control means 4 reads in the data or instructions stored on the storage medium 7 via the control cable 6. The read-out of these data allows the control means 4 to determine which particular charging process is to be carried out for the superconducting magnet coil 3 associated with the storage medium 7. In this manner a particular charging program is chosen by the control means 4 and the control means 4 controls the current or voltage values of the power supply 2 to charge the superconducting magnet coil 3 via current cable 4 in a desired manner. After the charging process has been satisfactorily terminated, the charging program directs short circuiting of the superconducting magnet 3 via switch 10, the charging current is withdrawn, and the current cable 5 as well as the control cable 6 are removed from the magnet coil 3 and the storage medium respectively in a conventional manner by the technician. The superconducting magnet 3 is thereby charged with the correct superconducting current and the power supply 1 is available for charging other superconducting magnets.

Figure 2A:
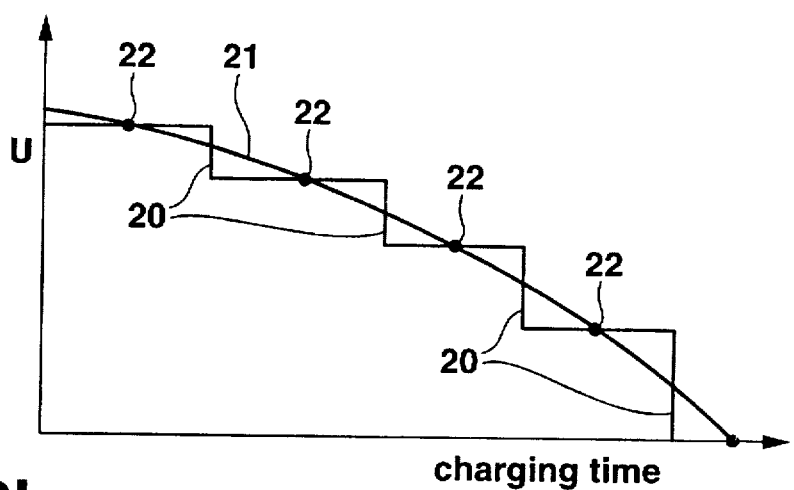
FIG. 2a shows the voltage versus charging time curve for a charging program.

FIG. 2a shows a typical charging curve. The voltage values U are changed as a function of charging time in a directed manner. In accordance with prior art, individual charging steps 20 were usually manually executed in the voltage versus charge-time curve. With the charging system in accordance with the invention a quasi-continuous charging of the magnet in accordance with curve 21 is possible. This can also take place by storing supporting points 22, for example, in the storage medium 7 with the control means 4 carrying out an interpolation between these supporting points 22. Typical voltage values are 3 volts or less and typical charging times 1 to 4 hours.

Figure 2B:
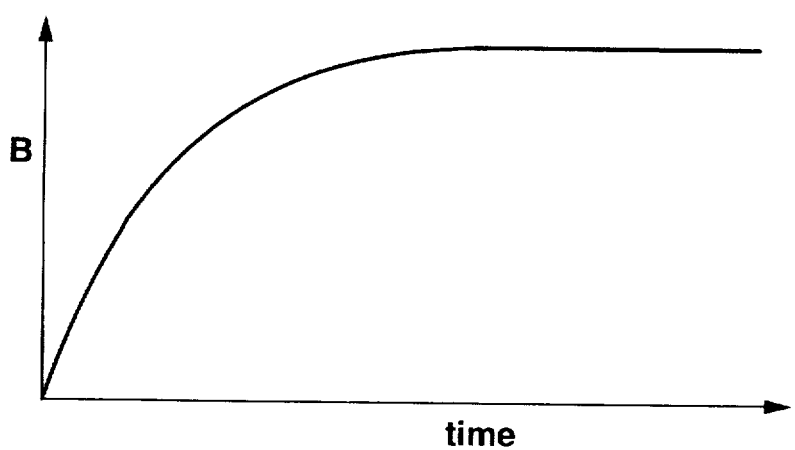

FIG. 2b shows a typical change of the magnetic field of a superconducting magnet 3 versus the charging time which could, for example, occur in accordance with FIG. 2a. After the desired B-field strength is achieved, the charging process is terminated.

We claim:

1. A magnet system comprising a superconducting magnet coil;

a superconducting switch for short-circuiting said superconducting magnet coil;

a power supply for charging said superconducting magnet coil;

a storage medium for storing data of said superconducting magnet coil; and control means for reading said data of said storage medium and for controlling said power supply to charge said superconducting magnet coil using said data.

2. The magnet system of claim 1, further comprising a cryostat within which said said superconducting magnet coil is disposed, wherein said storage medium comprises a terminal means which is accessible from outside said cryostat for connecting said storage medium to said control means.

3. The magnet system of claim 1, wherein said storage medium comprises an EPROM.

4. The magnet system of claim 1, wherein said storage medium comprises a bar code.

5. The magnet system of claim 1, wherein said storage medium contains a control program for controlled charging of said superconducting magnet coil.

6. The magnet system of claim 1, wherein said control means is adapted to enable charging of said superconducting magnet coil only after said data have been read into said control means.

7. The magnet system of claim 1, wherein said control means is adapted to enable charging of said superconducting magnet coil only when an electrical connection is maintained between said control means and said storage medium.

8. The magnet system of claim 1, wherein said control means is adapted to automatically charge said superconducting magnet coil.

9. The magnet system of claim 1, wherein said control means is adapted to disable said power supply.

10. The magnet system of claim 1, wherein said control means is adapted to prevent improper charging steps.

11. The magnet system of claim 10, wherein said control means limits a voltage and a current of said power supply.

12. The magnet system of claim 1, wherein said control means contains a previously stored charging program.

13. The magnet system of claim 1, further comprising a cryostat within which said superconducting magnet coil is disposed wherein said storage medium is permanently attached to an outside of said cryostat.

14. The magnet system of claim 1, wherein said storage medium is adapted to be written to.

15. The magnet system of claim 1, wherein said storage medium contains charging parameters.

16. The magnet system of claim 1, wherein said control means is adapted to charge with a continuous largely stepless dependence of a charging voltage.

17. The magnet system of claim 1, wherein said superconducting magnet coil is a nuclear magnetic resonance spectrometer magnet coil.

18. A method for charging a superconducting magnet coil of a magnet system comprising the following steps:

connecting a power supply to a superconducting magnet coil via a current lead;

reading data from a storage medium into a control means for said power supply;

opening a superconducting switch;

automatically charging said superconducting magnet coil using said power supply and said data read into said control means;

closing said superconducting switch;

reducing a charging current from said power supply to zero; and removing said current lead from said superconducting magnet coil.

* * * * *